(12) United States Patent
Zhou et al.

(10) Patent No.: US 10,578,986 B2
(45) Date of Patent: Mar. 3, 2020

(54) DUAL-LAYER ALIGNMENT DEVICE AND METHOD

(71) Applicant: SHANGHAI MICRO ELECTRONICS EQUIPMENT (GROUP) CO., LTD., Shanghai (CN)

(72) Inventors: Xuchao Zhou, Shanghai (CN); Liandong Pan, Shanghai (CN); Shucun Zhu, Shanghai (CN)

(73) Assignee: SHANGHAI MICRO ELECTRONICS EQUIPMENT (GROUP) CO., LTD., Shanghai (CN)

( * ) Notice: Subject to any disclaimer, the term of this patent is extended or adjusted under 35 U.S.C. 154(b) by 0 days.

(21) Appl. No.: 16/097,500

(22) PCT Filed: Apr. 28, 2017

(86) PCT No.: PCT/CN2017/082493
§ 371 (c)(1),
(2) Date: Oct. 29, 2018

(87) PCT Pub. No.: WO2017/186170
PCT Pub. Date: Nov. 2, 2017

(65) Prior Publication Data
US 2019/0146364 A1 May 16, 2019

(30) Foreign Application Priority Data
Apr. 29, 2016 (CN) .......................... 2016 1 0284287

(51) Int. Cl.
*G03F 7/20* (2006.01)
*G03F 9/00* (2006.01)
(Continued)

(52) U.S. Cl.
CPC ........ *G03F 9/7088* (2013.01); *G03F 7/70716* (2013.01); *G03F 7/70775* (2013.01);
(Continued)

(58) Field of Classification Search
CPC .. G03F 9/7088; G03F 9/7015; G03F 7/70775; G03F 7/70716; G03F 7/70825
(Continued)

(56) References Cited

U.S. PATENT DOCUMENTS 6,642,995 B2  11/2003  Sweatt et al.
2009/0251699 A1  10/2009  George
(Continued)

FOREIGN PATENT DOCUMENTS

CN   1794096 A   6/2006
CN   1794097 A   6/2006
(Continued)

*Primary Examiner* — Hung Nguyen
(74) *Attorney, Agent, or Firm* — Muncy, Geissler, Olds & Lowe, PC

(57) ABSTRACT

A dual-layer alignment apparatus is disclosed which includes: a fixed frame (40) and, disposed thereon, a first measuring device (50) and a mark plate (41), the mark plate (41) having a fixed-frame mark (20); and a motion stage (60) and, disposed thereon, a reference mark (30), a motion-stage mark (70) and a second measuring device (10). The first measuring device (50) is configured to measure a relative positional relationship between the reference mark (30) and the motion-stage mark (70), the second measuring device (10) is configured to measure a relative positional relationship between the reference mark (30) and the fixed-frame mark (20), from which a final relative positional relationship between the motion-stage mark (70) and the fixed-frame mark (20) is derived, based on which the motion stage (60) is displaced to a target location. A corresponding dual-layer alignment method is also disclosed. In the apparatus, the motion stage (60) is the only movable component. Additionally, coordinate relationships can be calibrated in a static manner in order to immunize calibration accuracy from positioning accuracy of the motion stage (60), such that the alignment accuracy is improved. Further, a dual- or multi- (Continued)

lens design can be employed to allow additional improvements in flexibility and alignment efficiency.

10 Claims, 4 Drawing Sheets

(51) Int. Cl.
*H01L 21/68* (2006.01)
*H01L 23/544* (2006.01)
(52) U.S. Cl.
CPC ............ *G03F 7/70825* (2013.01); *G03F 9/00* (2013.01); *G03F 9/7015* (2013.01); *G03F 9/7038* (2013.01); *H01L 21/681* (2013.01); *H01L 23/544* (2013.01)
(58) Field of Classification Search
USPC ................................................ 355/53, 72–76
See application file for complete search history.

(56) References Cited

U.S. PATENT DOCUMENTS

| | | | | |
|---|---|---|---|---|
| 2012/0078561 | A1* | 3/2012 | Knijn ................. | G03F 7/70516 |
| | | | | 702/94 |
| 2013/0335722 | A1* | 12/2013 | Aangenent .......... | G03F 7/70866 |
| | | | | 355/72 |
| 2015/0098073 | A1* | 4/2015 | Butler ................ | G03F 7/70775 |
| | | | | 355/72 |

FOREIGN PATENT DOCUMENTS

| | | |
|---|---|---|
| CN | 101021694 A | 8/2007 |
| CN | 101158818 A | 4/2008 |
| EP | 1134618 A2 | 9/2001 |

* cited by examiner

```
┌─────────────────────────────────────────────────────────┐
│   Provide a fixed frame and, disposed thereon, a first  │
│  measuring device and a mark plate bearing a fixed-frame│
│                          mark                           │
└─────────────────────────────────────────────────────────┘
                              │
┌─────────────────────────────────────────────────────────┐
│  Provide a motion stage and, disposed thereon, a reference│
│  mark, a motion-stage mark and a second measuring device│
└─────────────────────────────────────────────────────────┘
                              │
┌─────────────────────────────────────────────────────────┐
│    Measure a relative positional relationship between the│
│     reference mark and the motion-stage mark by the first│
│                    measuring device                     │
└─────────────────────────────────────────────────────────┘
                              │
┌─────────────────────────────────────────────────────────┐
│    Measure a relative positional relationship between the│
│    reference mark and the fixed-frame mark by the second│
│                    measuring device                     │
└─────────────────────────────────────────────────────────┘
                              │
┌─────────────────────────────────────────────────────────┐
│  Derive a relative positional relationship between the motion-│
│          stage mark and the fixed-frame mark            │
└─────────────────────────────────────────────────────────┘
                              │
┌─────────────────────────────────────────────────────────┐
│ Displace the motion stage to a target location based on the│
│           third relative positional relationship        │
└─────────────────────────────────────────────────────────┘
```

Fig. 5

DUAL-LAYER ALIGNMENT DEVICE AND METHOD

TECHNICAL FIELD

The present invention relates to the field of photolithography and, in particular, to a dual-layer alignment apparatus and a dual-layer alignment method.

BACKGROUND

In semiconductor photolithography equipment, alignment is a critical subsystem because its accuracy tends to determine the overlay accuracy of the semiconductor photolithography equipment. Machine vision-based alignment systems have gained extensive use because of a range of advantages such as a simple structure, high speed and high precision.

A photolithography tool employs an objective lens for correlating reticle coordinates to wafer coordinates. However, due to the absence of such a high-precision optical member as the objective lens, a structurally simpler quasi-lithography apparatus has to rely on dedicated optical and control systems for dual-layer alignment.

US Pat. App. Pub. No. 2009/0251699 A1 discloses a dual-layer alignment solution in which a movable beam splitter is disposed between the dual-layer objects to be aligned with each other. This beam splitter is capable of imaging marks on both the top and bottom layers. A lens is carried by a motion stage to or from a position for alignment. However, in this solution, since the motion stage and the lens are independent of each other, the system is complex in terms of structure and motion control, which is unfavorable to alignment accuracy and reliability.

SUMMARY OF THE INVENTION

In order to overcome the problems associated with the conventional solutions, the present invention provides an alignment apparatus, including:

a fixed frame and, disposed thereon, a first measuring device and a mark plate, the mark plate having a fixed-frame mark; and a motion stage and, disposed thereon, a reference mark, a motion-stage mark and a second measuring device, wherein the first measuring device is configured to measure a first relative positional relationship between the reference mark and the motion-stage mark, wherein the second measuring device is adapted to measure a second relative positional relationship between the reference mark and the fixed-frame mark, and wherein the motion stage is movable to a target location based on a third relative positional relationship between the motion-stage mark and the fixed-frame mark derived from the first and second relative positional relationships.

Optionally, the motion-stage mark may be arranged on an object to be aligned that is supported on the motion stage so as to be moveable with the motion stage.

Optionally, the second measuring device may be a beam splitter allowing the fixed-frame mark and the reference mark to be simultaneously located in two respective fields of view of the beam splitter so that relative positions of the fixed-frame mark and the reference mark are measurable.

Optionally, the fixed-frame mark may include two marking points which, as a result of movement of the motion stage, are successively locatable in a same one of the fields of view of the second measuring device, where respective distances between the two marking points and the reference mark as well as an angle of rotation of a direction of the movement with respect to a line connecting the two marking points are calculated, based on which the second relative positional relationship between the fixed-frame mark and the reference mark is obtainable.

Optionally, as a result of movement of the motion stage, the motion-stage mark and the reference mark may be successively locatable in a field of view of the first measuring device, where the first measuring device measures a position of the motion-stage mark and a position of the reference mark on the motion stage, respectively, based on which the first relative positional relationship between the motion-stage mark and the reference mark is obtainable.

Optionally, the fixed-frame mark may include a first calibration mark configured for static calibration of a coordinate relationship between the second measuring device and the fixed frame, wherein the reference mark includes a second calibration mark configured for static calibration of a coordinate relationship between the first measuring device and the motion stage.

Optionally, a plurality of first measuring devices may be included for simultaneously measuring positions of the motion-stage mark and the reference mark on the motion stage.

Optionally, the dual-layer alignment apparatus may further include a first light source and a second light source that are respectively connected to the second measuring device and the first measuring device and are configured to provide illumination fields of view of the second measuring device and the first measuring device.

Optionally, the dual-layer alignment apparatus may further include two cameras connected respectively to the second measuring device and the first measuring device, the cameras configured to image the fixed-frame mark, the motion-stage mark and the reference mark.

Optionally, the second measuring device may include:

two reflectors, configured to form the two respective fields of view, in which the fixed-frame mark and the reference mark are locatable, by reflecting light from the first light source, the two reflectors further configured to provide the fixed-frame mark and the reference mark with imaging light; and two lenses, configured to respectively transmit an incident light and the imaging light.

The present invention also provides a dual-layer alignment method, including:

providing a fixed frame and, disposed thereon, a first measuring device and a mark plate, the mark plate having a fixed-frame mark;

providing a motion stage and, disposed thereon, a reference mark, a motion-stage mark and a second measuring device;

measuring a first relative positional relationship between the reference mark and the motion-stage mark by the first measuring device;

measuring a second relative positional relationship between the reference mark and the fixed-frame mark by the second measuring device;

deriving a third relative positional relationship between the motion-stage mark and the fixed-frame mark from the first and second relative positional relationships; and displacing the motion stage to a target location based on the third relative positional relationship.

In summary, the present invention provides an alignment apparatus, including: a fixed frame and, disposed thereon, a first measuring device and a mark plate bearing a fixed-frame mark: and a motion stage and, disposed thereon, a reference mark, a motion-stage mark and a second measuring device, wherein the first measuring device is configured to measure a relative positional relationship between the reference mark and the motion-stage mark, wherein the second measuring device is adapted to measure a relative positional relationship between the reference mark and the fixed-frame mark, and wherein from the aforementioned two relative positional relationships is derived a final relative positional relationship between the motion-stage mark and the fixed-frame mark, based on which the motion stage is displaced to a target location. The present invention also provides a corresponding dual-layer alignment method. The beam splitter disposed on the motion stage enables simultaneous imaging of the two optical paths. In the apparatus, the motion stage is the only movable component. Additionally, coordinate relationships can be calibrated in a static manner in order to immunize calibration accuracy from positioning accuracy of the motion stage. For these reasons, an improvement in alignment accuracy is achievable. Further, a dual- or multi-lens design can be employed to allow additional improvements in flexibility and alignment efficiency.

BRIEF DESCRIPTION OF THE DRAWINGS

FIG. 5 is a flowchart of a dual-layer alignment method according to one embodiment of the present invention.

DETAILED DESCRIPTION OF PREFERRED EMBODIMENTS

The present invention will be described in greater detail below with reference to a few specific embodiments which are to be read in connection with the accompanying drawings. Features and advantages of the invention will be more apparent from the following detailed description, and from the appended claims. Note that these figures are provided in a very simplified form and not necessarily drawn to scale, with the only purpose to facilitate convenience and clarity in explaining the several embodiments.

Figure 1:
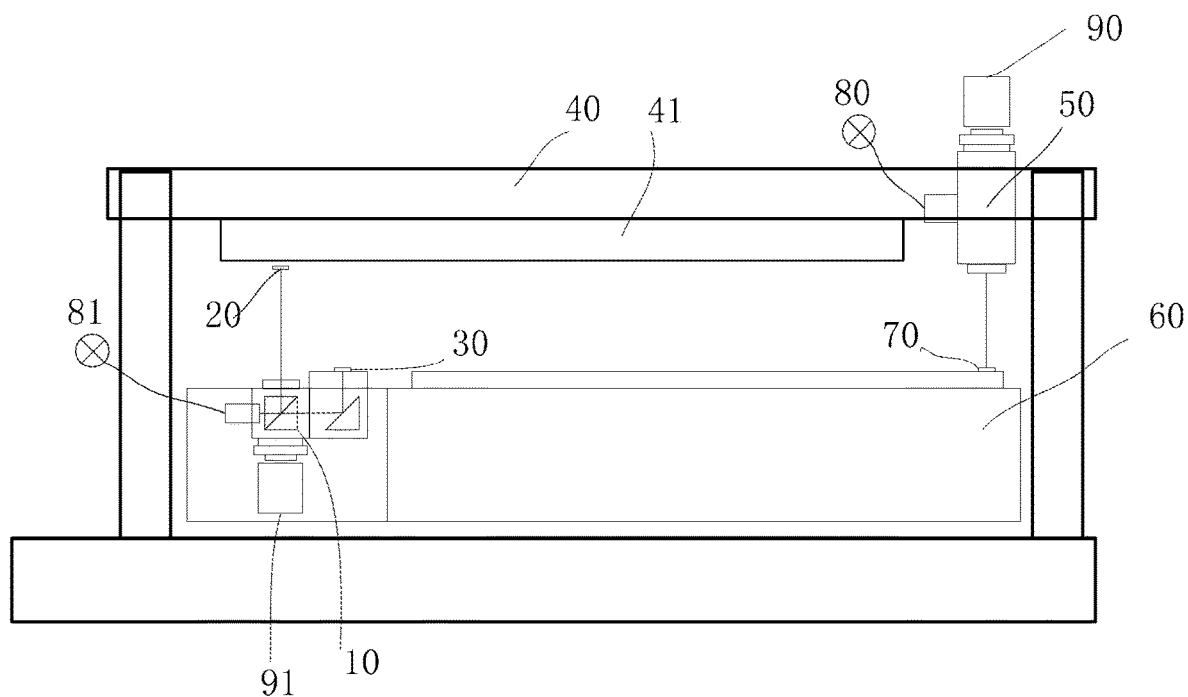
FIG. 1 is a schematic view of a dual-layer alignment apparatus according to one embodiment of the present invention.

Referring to FIG. 1, the present invention provides a dual-layer alignment apparatus, including:

a fixed frame 40, a first measuring device 50 and a mark plate 41 disposed on the fixed frame 40. The mark plate 41 has a fixed-frame mark 20 fixed thereon; and a motion stage 60, a reference mark 30, a motion-stage mark 70 and a second measuring device 10 disposed on the motion stage 60. The first measuring device 50 is configured to measure a relative positional relationship between the reference mark 30 and the motion-stage mark 70. The second measuring device 10 is adapted to measure a relative positional relationship between the reference mark 30 and the fixed-frame mark 20. From these two relative positional relationship can be derived a final relative positional relationship between the motion-stage mark 70 and the fixed-frame mark 20, based on which the motion stage 70 can be moved to a target position.

In one embodiment, the second measuring device 10 is implemented as a beam splitter, and the first measuring device 50 as a lens. In this case, the dual-layer alignment apparatus is comprised of the beam splitter 10, the fixed-frame mark 20, the reference mark 30, the fixed frame 40, the mark plate 41, the lens 50, the motion stage 60, the motion-stage mark 70, a second light source 80, a first light source 81 and cameras 90, 91. The fixed-frame mark 20 is fixed and immobilized on the fixed frame 40, whilst the reference mark 30 is fixed on the motion stage 60 and movable with the motion stage 60. The fixed frame 40 is provided to fix the camera 90, the second light source 80, the lens 50, the mark plate 41 and other components. The mark plate 41 is connected to the fixed frame 40 and configured to support the fixed-frame mark 20. The first light source 81 and the second light source 80 are connected to the beam splitter 10 and the lens 50, respectively, so as to provide light source and fields of view for the beam splitter 10 and the lens 50.

The motion stage 60 is able to carry the beam splitter 10, the reference mark 30 and the motion-stage mark 70 to move in six degrees of freedom, i.e., i.e., X, Y, Z, Rz, Rx, and Ry. The motion-stage mark 70 may be arranged on an object to be aligned that is placed on the motion stage 60 and may move with the motion stage 60. The lens 50 can image the reference mark 30 or the motion-stage mark 70 on a target surface of the camera 90.

The dual-layer alignment apparatus of the present invention aims to determine a relative positional relationship between the mark plate 41 and the object on the motion stage 60, i.e., the relative positional relationship between the fixed-frame mark 20 and the motion-stage mark 70 (through coordinate conversion). According to the present invention, alignment is accomplished with dedicated opto-mechanical means and strategies and process flows for calibration of coordinate conversion relationships as well as for alignment.

Specifically, the relative positional relationship between the fixed-frame mark 20 and the motion-stage mark 70 is derived from the relative positional relationship between the fixed-frame mark 20 and the reference mark 30 and from the relative positional relationship between the motion-stage mark 70 and the reference mark 30.

According to the present invention, the determination of the relative positional relationship between the fixed-frame mark 20 and the motion-stage mark 70 may be accomplished by an alignment process including the steps as detailed below.

Figure 3:
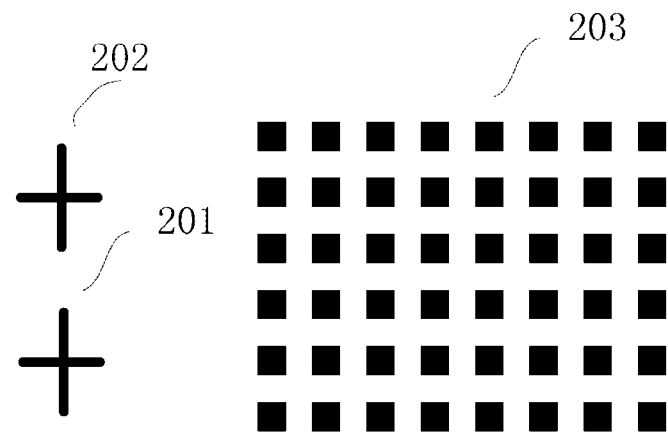
FIG. 3 is a schematic view of a fixed-frame mark in a dual-layer alignment apparatus according to one embodiment of the present invention.

In Step 1, a positional relationship between the fixed frame 41 and the motion stage 60, i.e., the relative positional relationship between the fixed-frame mark 20 and the reference mark 30 is calculated. This can be done by simultaneously locating the fixed-frame mark 20 and the reference mark 30 in the two respective fields of view of the beam splitter 10, where relative positions of the fixed-frame mark 20 and the reference mark 30 are measured. As shown in FIG. 3, the fixed-frame mark 20 may include two marking points 201, 202 which may, as a result of moving the motion stage 60, be successively located in one of the fields of view of the beam splitter 10, where their respective distances from the reference mark 30 and an angle of rotation with respect to the direction of the movements are calculated, based on which relative positions of the fixed-frame mark 20 and the reference mark 30 are obtainable.

Figure 4:
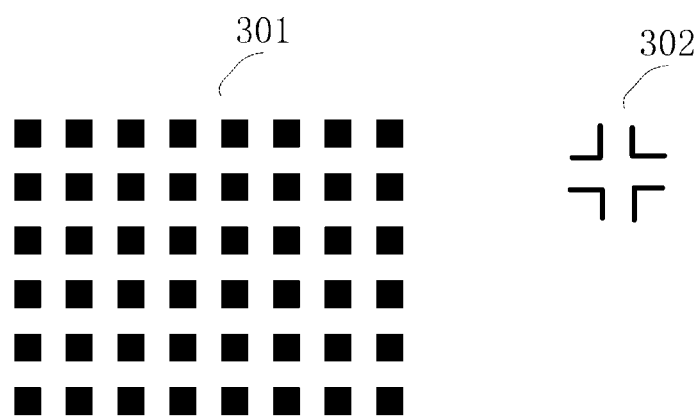
FIG. 4 is a schematic view of a reference mark in a dual-layer alignment apparatus according to one embodiment of the present invention.

Step 1 may in particular include:

1) locating the marking point 201 into one of the fields of view of the beam splitter 10 and the reference mark 30 in the other field of view of the beam splitter 10 as a result of movement of the motion stage 60 and measuring the distance between the marking point 201 and a marking point 302 of the reference mark 30 (as shown in FIG. 4, the reference mark 30 includes the marking point 302);

2) locating the marking point 202 into the same field of view of the beam splitter 10 as a result of further moving the motion stage 60 a distance equal to a nominal distance between the marking points 201, 202, with the marking point 302 being still retained in the other field of view of the beam splitter 10, and measuring the distance between the marking points 202, 302; and 3) deriving a relative positional relationship between the fixed-frame mark 20 and the marking point 302 in the reference mark 30 from the distance measurements obtained in 1) and 2) and calculating an angle of rotation in the Rz-direction of the marking points 201, 202, i.e., amount of rotation in the Rz-direction of the fixed frame 40 relative to the motion stage 60, as well as a position of the fixed-frame mark 20 relative to the reference mark 30.

In Step 2, with a position where the lens 50 is mounted as a reference, relative positions of the motion-stage mark 70 and the reference mark 30 are measured. Wherein, the motion stage 60 is moved so that the motion-stage mark 70 and reference mark 30 are successively located into a field of view of the lens 50, where the lens 50 measures the positions of the motion-stage mark 70 and the reference mark 30 on the motion stage 60, from which the relative positional relationship between the motion-stage mark 70 and the reference mark 30 is obtainable.

Step 2 may in particular include:

1) locating the motion-stage mark 70 into the field of view of the lens 50 as a resulting of moving the motion stage 60, where a pixel position of the motion-stage mark 70 is calculated, and calculating a position of the motion-stage mark 70 in a coordinate system of the motion stage 60 based on the current position of the motion stage 60;

2) locating the reference mark 30 into the field of view of the lens 50 as a resulting of further movement of the motion stage 60, where a pixel position of the reference mark 30 is calculated, and calculating a position of the reference mark 30 in the coordinate system of the motion stage 60 based on the current position of the motion stage 60; and 3) deriving the relative positional relationship between the motion-stage mark 70 and the reference mark 30 based on the calculation results obtained in 1) and 2).

In Step 3, Steps 1 and 2 are repeated at multiple points because of higher accuracy of a multi-point alignment model. Typically, the positions of more than three points are measured. The relative positional relationship between the fixed-frame mark 20 and the motion-stage mark 70 for enabling the dual-layer alignment is derived from the positional relationships between the fixed-frame mark 20 and the reference mark 30 and between the reference mark 30 and the motion-stage mark 70.

In Step 4, the motion stage 60 is displaced to a position calculated in Step 3, thereby completing the alignment process.

In another embodiment, in order increase alignment efficiency, a plurality of lenses 50 can be included to simultaneously measure positions of the motion-stage mark 70 and of the reference mark 30 on the motion stage 60. That is, mark position measurements can be performed in parallel to accelerate the alignment process.

Figure 2:
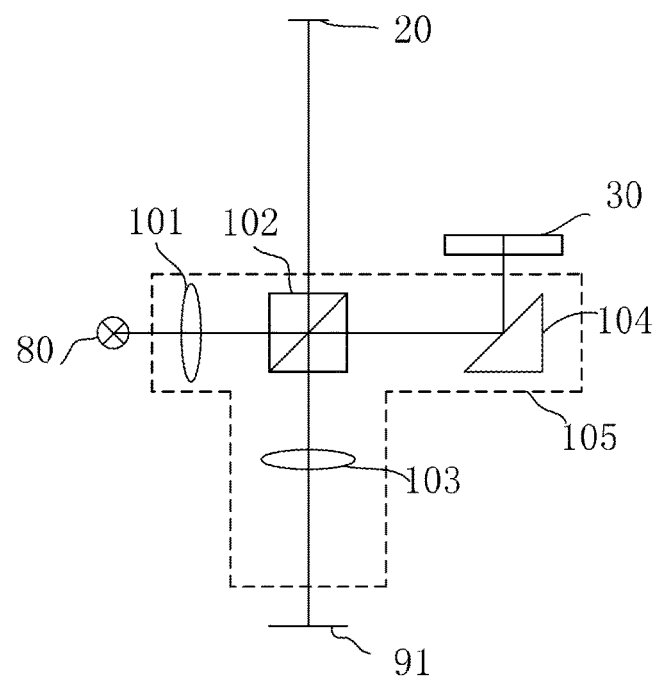
FIG. 2 is a schematic view of a second measuring device in a dual-layer alignment apparatus according to one embodiment of the present invention.

According to one embodiment, as shown in detail in FIG. 2, the beam splitter 10 includes: two reflectors 102, 104, configured to form the two fields of view, in which the fixed-frame mark 20 and the reference mark 30 are locatable, by reflecting light from the first light source 81, and to provide the fixed-frame mark 20 and the reference mark 30 with imaging light; and two lens 101, 103, configured to respectively transmit the incident light and the imaging light. In addition, a housing 105 may be provided to provide protection. The light from the first light source 81 may be reflected and refracted by lens groups so as to illuminate both the fixed-frame mark 20 and the reference mark 30. The fixed-frame mark 20 and the reference mark 30 may be simultaneously imaged by the camera 91.

According to the present invention, two calibrations may be involved respectively for a relationship between a pixel coordinate system of the beam splitter 10 and a physical coordinate system of the mark plate 41 and for a relationship between a pixel coordinate system of the lens 50 and a physical coordinate system of the motion stage 60. In order to immunize calibration accuracy from positioning accuracy of the motion stage, the calibration may be static calibrations. As shown in FIGS. 3 and 4, the fixed-frame mark 20 may include a first calibration mark 203 configured for static calibration of a coordinate relationship between the beam splitter 10 and the fixed frame 40, and the reference mark 30 may include a second calibration mark 301 configured for static calibration of a coordinate relationship between the lens 50 and the motion stage 60. The calibrations for the beam splitter 10 and the lens 50 will be detailed in greater detail below.

Beam Splitter 10: The fixed-frame mark 20 is shown in FIG. 3, the calibration mark 203 may have a nominal pitch between calibration dots therein. Based on a lens magnification, an actual physical distance from any one of the calibration dots to the first calibration dot at the left upper corner, i.e., a physical position of the former relative to the latter can be calculated. An image position extraction algorithm may be carried out to determine a pixel coordinate position of the calibration dot relative to the first calibration dot at the left upper corner. A least square method may be then used to convert the pixel coordinate position to the physical position. In addition, as the mark plate 41 may be rotated relative to the motion stage 60 in the Rz-direction, the amount of rotation in the Rz-direction needs to be calculated beforehand, for example using the approach as described above in connection with Step 1 of the alignment process, and taken into account in the coordinate conversion.

Lens 50: The calibration for the lens 50 may be carried out in a similar manner using the second calibration mark, The reference mark 30 is shown in FIG. 4.

As shown in FIG. 5, the present invention also provides a dual-layer alignment method, including providing a fixed frame and a fixed-frame mark disposed thereon;

providing a motion stage, a motion-stage mark and a measuring device disposed on the motion stage;

measuring a relative positional relationship between the fixed-frame mark and the motion-stage mark by the measuring device, the measurement further including: measuring a relative positional relationship between a reference mark on the motion stage and the motion-stage mark by a first measuring device; measuring a relative positional relationship between the reference mark and the fixed-frame mark by a second measuring device; and deriving the relative positional relationship between the fixed-frame mark and the motion-stage mark; and displacing the motion stage to a target location based on the derived relative positional relationship.

Figure 6:
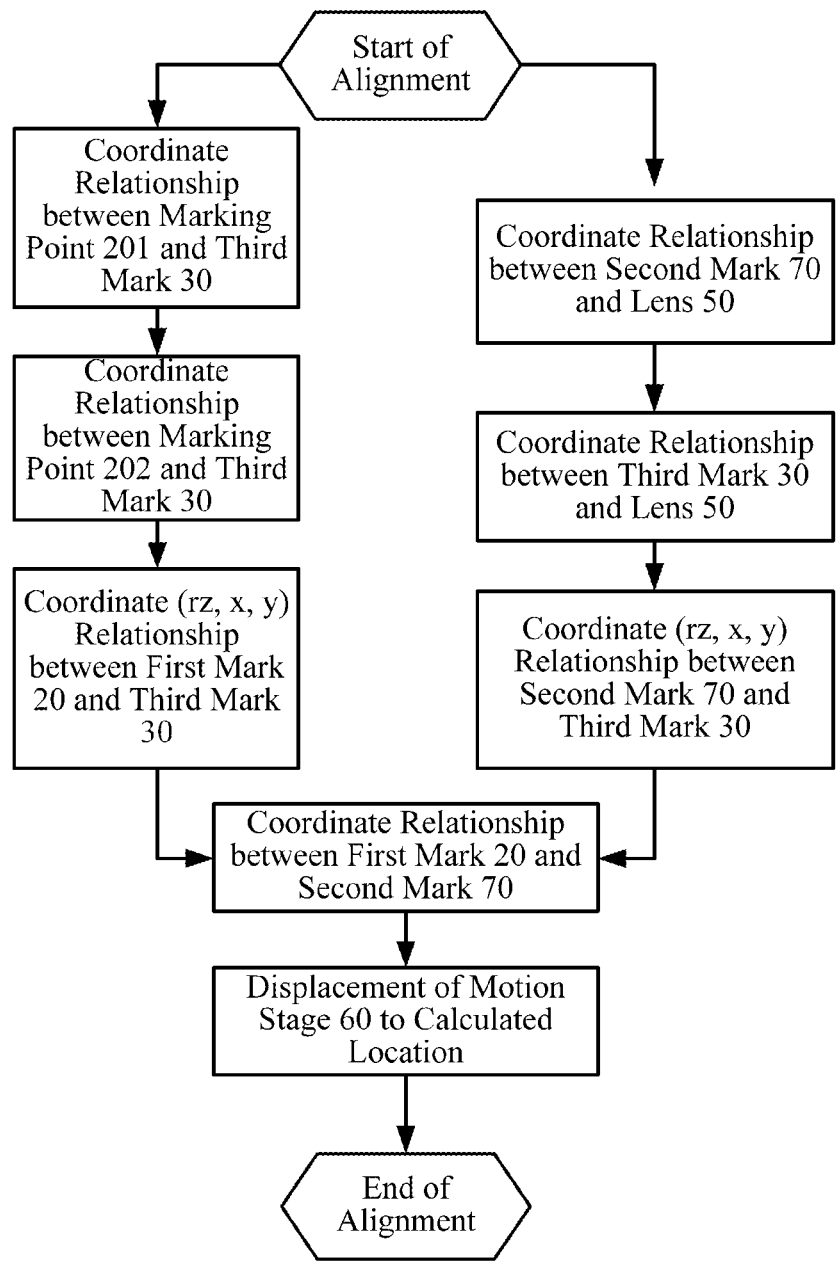
FIG. 6 is a detailed flowchart of a dual-layer alignment method according to one embodiment of the present invention.

It will be appreciated that the dual-layer alignment method has all the features of the dual-layer alignment apparatus as discussed above and will not be described in further detail. FIG. 6 shows a detailed flowchart of the dual-layer alignment method according to one embodiment of the present invention.

As shown, a coordinate relationship between the fixed-frame mark 20 and the motion-stage mark 70 is derived from measured coordinate relationships, respectively, between the fixed-frame mark 20 and the reference mark 30 and between the motion-stage mark 70 and the reference mark 30.

The motion stage 60 is then displaced to a position indicated by the results of the calculations.

As shown in FIG. 6, the coordinate relationship between the fixed-frame mark 20 and the reference mark 30 is derived from a coordinate relationship between the marking point 201 and the reference mark 30 and from a coordinate relationship between the marking point 202 and the reference mark 30, and the coordinate relationship between the motion-stage mark 70 and the reference mark 30 is derived from a coordinate relationship between the motion-stage mark 70 and the lens 50 and a coordinate relationship between the reference mark 30 and the lens 50.

The present invention provides an alignment apparatus, including: a fixed frame and, disposed thereon, a first measuring device and a mark plate bearing a fixed-frame mark; and a motion stage and, disposed thereon, a reference mark, a motion-stage mark and a second measuring device, wherein the first measuring device is configured to measure a relative positional relationship between the reference mark and the motion-stage mark, wherein the second measuring device is adapted to measure a relative positional relationship between the reference mark and the fixed-frame mark, and wherein from the aforementioned two relative positional relationships is derived a final relative positional relationship between the motion-stage mark and the fixed-frame mark, based on which the motion stage is displaced to a target location. The present invention also provides a corresponding dual-layer alignment method. In the apparatus, the motion stage is the only movable component. Additionally, coordinate relationships can be calibrated in a static manner in order to immunize calibration accuracy from positioning accuracy of the motion stage. For these reasons, an improvement in alignment accuracy is achievable. Further, a dual- or multi-lens design can be employed to allow additional improvements in flexibility and alignment efficiency.

It is apparent that those skilled in the art can make various modifications and variations to the present invention without departing from the spirit and scope thereof. Accordingly, the invention is intended to embrace all such modifications and variations if they fall within the scope of the appended claims and equivalents thereof.

What is claimed is:

1. A dual-layer alignment apparatus, comprising:
    a fixed frame and, disposed thereon, a first measuring device and a mark plate, the mark plate having a fixed-frame mark; and
    a motion stage and, disposed thereon, a reference mark, a motion-stage mark and a second measuring device,
    wherein the first measuring device is configured to measure a first relative positional relationship between the reference mark and the motion-stage mark, wherein the second measuring device is configured to measure a second relative positional relationship between the reference mark and the fixed-frame mark, and wherein the motion stage is movable to a target location based on a third relative positional relationship between the motion-stage mark and the fixed-frame mark derived from the first and second relative positional relationships,
    wherein the second measuring device is a beam splitter allowing the fixed-frame mark and the reference mark to be simultaneously located in two respective fields of view of the beam splitter so that relative positions of the fixed-frame mark and the reference mark are measurable.

2. The dual-layer alignment apparatus of claim 1, wherein the motion-stage mark is arranged on an object to be aligned that is supported on the motion stage so as to be moveable with the motion stage.

3. The dual-layer alignment apparatus of claim 1, wherein the fixed-frame mark comprises two marking points which, as a result of movement of the motion stage, are successively locatable in a same one of the fields of view of the second measuring device, where respective distances between the two marking points and the reference mark, and an angle of rotation of a direction of the movement with respect to a line connecting the two marking points are calculated, based on which the second relative positional relationship between the fixed-frame mark and the reference mark is obtainable.

4. The dual-layer alignment apparatus of claim 1, wherein as a result of movement of the motion stage, the motion-stage mark and the reference mark are successively locatable in a field of view of the first measuring device, where the first measuring device measures a position of the motion-stage mark and a position of the reference mark on the motion stage, respectively, based on which the first relative positional relationship between the motion-stage mark and the reference mark is obtainable.

5. The dual-layer alignment apparatus of claim 4, wherein the fixed-frame mark comprises a first calibration mark configured for static calibration of a coordinate relationship between the second measuring device and the fixed frame, and wherein the reference mark comprises a second calibration mark configured for static calibration of a coordinate relationship between the first measuring device and the motion stage.

6. The dual-layer alignment apparatus of claim 4, comprising a plurality of first measuring devices for simultaneously measuring the positions of the motion-stage mark and the reference mark on the motion stage.

7. The dual-layer alignment apparatus of claim 4, further comprising a first light source and a second light source that are respectively connected to the second measuring device and the first measuring device and are configured to provide illumination fields of view of the second measuring device and the first measuring device.

8. The dual-layer alignment apparatus of claim 4, further comprising two cameras connected respectively to the second measuring device and the first measuring device, the cameras configured to image the fixed-frame mark, the motion-stage mark and the reference mark.

9. The dual-layer alignment apparatus of claim 7, wherein the second measuring device comprises:
    two reflectors, configured to form the two respective fields of view, in which the fixed-frame mark and the reference mark are locatable, by reflecting light from the first light source, the two reflectors further configured to provide the fixed-frame mark and the reference mark with imaging light; and two lenses, configured to respectively transmit an incident light and the imaging light.

10. A dual-layer alignment method, comprising:

providing a fixed frame and, disposed thereon, a first measuring device and a mark plate, the mark plate having a fixed-frame mark;

providing a motion stage and, disposed thereon, a reference mark, a motion-stage mark and a second measuring device, wherein the second measuring device is a beam splitter allowing the fixed-frame mark and the reference mark to be simultaneously located in two respective fields of view of the beam splitter so that relative positions of the fixed-frame mark and the reference mark are measurable;

measuring a first relative positional relationship between the reference mark and the motion-stage mark by the first measuring device;

measuring a second relative positional relationship between the reference mark and the fixed-frame mark by the second measuring device;

deriving a third relative positional relationship between the motion-stage mark and the fixed-frame mark from the first and second relative positional relationships; and displacing the motion stage to a target location based on the third relative positional relationship.

* * * * *